United States Patent [19]
Filipiak et al.

[11] Patent Number: 5,918,147
[45] Date of Patent: Jun. 29, 1999

[54] PROCESS FOR FORMING A SEMICONDUCTOR DEVICE WITH AN ANTIREFLECTIVE LAYER

[75] Inventors: Stanley M. Filipiak, Pflugerville; Ted R. White; T. P. Ong, both of Austin; Jung-Hui Lin, Gilbert; Wayne M. Paulson; Bernard J. Roman, both of Austin, all of Tex.

[73] Assignee: Motorola, Inc., Schaumburg, Ill.

[21] Appl. No.: 08/413,021

[22] Filed: Mar. 29, 1995

[51] Int. Cl.$^6$ ................................................. H01L 21/318
[52] U.S. Cl. ........................... 438/636; 438/785; 438/791
[58] Field of Search ................................... 438/636, 785, 438/786, 791, 792, 793, 794

[56] References Cited

U.S. PATENT DOCUMENTS

| | | | |
|---|---|---|---|
| 4,488,775 | 12/1984 | Yamamoto | 350/164 |
| 4,545,646 | 10/1985 | Chern et al. | 350/162.2 |
| 4,820,611 | 4/1989 | Arnold et al. | 430/271 |
| 4,968,117 | 11/1990 | Chern et al. | 350/162.24 |
| 4,990,995 | 2/1991 | Maa | 357/67 |
| 5,037,777 | 8/1991 | Mele et al. | 437/195 |
| 5,066,615 | 11/1991 | Brady et al. | 437/229 |
| 5,091,244 | 2/1992 | Biornard | 428/216 |
| 5,135,877 | 8/1992 | Albergo et al. | 437/23 |
| 5,219,793 | 6/1993 | Cooper et al. | 437/195 |
| 5,258,643 | 11/1993 | Cohen | 257/530 |
| 5,292,417 | 3/1994 | Kugler | 204/192.13 |
| 5,378,659 | 1/1995 | Roman et al. | 437/229 |
| 5,428,244 | 6/1995 | Segawa et al. | 257/646 |
| 5,488,246 | 1/1996 | Hayashide et al. | 257/336 |
| 5,525,542 | 6/1996 | Maniar et al. | 437/186 |
| 5,539,249 | 7/1996 | Roman et al. | 257/649 |
| 5,595,938 | 1/1997 | Miyazaki | 437/195 |
| 5,643,806 | 7/1997 | Miwa et al. | 437/31 |

FOREIGN PATENT DOCUMENTS

| | | | |
|---|---|---|---|
| 0 588 087 A2 | 3/1994 | European Pat. Off. | H01L 21/027 |
| 43 11 761 A1 | 10/1993 | Germany | G03F 7/09 |
| 1047082 | 2/1989 | Japan . | |
| 64-41852 | 2/1989 | Japan | G01N 27/30 |
| 1-241125 | 9/1989 | Japan | H01L 21/30 |
| 2246905 | 12/1992 | United Kingdom . | |
| WO89/09494 | 10/1989 | WIPO | H01L 27/12 |

OTHER PUBLICATIONS

Legrand, et al., "Optical Properties of Sputter–Deposited Aluminum Nitride Films on Silicon," Thin Solid Films, 248; pp. 220–223 (1994).

Dijkstra, et al, "Optimization of Anti–Reflection Layers for Deep UV Lithography," SPIE vol. 1927, Optical/Laser Microlithography VI; pp. 275–286 (1993).

Czech, et al., "Reduction of Linewidth Variation for the Gate Conductor Level by Lithography Based on a New Antireflective Layer," Microelectronic Engineering 21; pp. 51–60 (1993).

Gordon, et al., "Chemical Vapor Deposition of Aluminum Nitride Thin Films," J. Mater. Res. vol. 7, No. 7; pp. 1679–1684 (1992).

Yu, et al., "Deposition, Characterization, and Application of Aluminum Nitride Thin Films for Microelectronics," Mat. Res. Soc. Symp. Proc. vol. 264; pp. 401–405 (1992).

Schattenburg, et al., "Fabrication and Testing of 0.1–um–Linewidth Microgap X–Ray Masks," J. Vac. Sci. Technol. B 8 (6); pp. 1604–1608 (1990).

(List continued on next page.)

*Primary Examiner*—Charles Bowers
*Assistant Examiner*—Matthew Whipple
*Attorney, Agent, or Firm*—George R. Meyer

[57] ABSTRACT

Antireflective layers (54, 86, and 109) have been developed that have discrete portions (541, 542, 861, 862, 863, 1091, and 1092). The discrete portions (541, 542, 861, 862, 863, 1091, and 1092) allow the antireflective layers (54, 86, and 109) to be used in many instances where using a single layer of uniform composition would be difficult or impossible. Alternatively, a single antireflective layer with a continuously graded composition can be used.

42 Claims, 6 Drawing Sheets

OTHER PUBLICATIONS

Lau, et al., "Stability of Electrical Properties of Nitrogen–Rich, Silicon–Rich, and Stoichiometric Silicon Nitride Films," J. Appl. Phys., vol. 66, No. 6; pp. 2765–2767 (1989).

Kim, et al., "Amorphous Silicon Thin–Film Transistors with Two–Layer Gate Insulator," Appl. Phys. Lett. 54, No. 21; pp. 2079–2081 (1989).

Pampalone, et al., "Improved Photoresist Patterning over Reflective Topographies Using Titanium Oxynitride Antireflection Coatings," J. Electrochem. Soc., vol. 136, No. 4; pp. 1181–1185 (1989).

Kanicki, "Roll of Hydrogen in Silicon Nitride Films Prepared by Various Deposition Techniques," Mat. Res. Soc. Symp. Proc., vol. 118, pp. 671–677 (1988).

Kumar, et al., "Growth and Properties of TiN and TiOxNy Diffusion Barriers in Silicon on Sapphire Integrated Circuits," Thin Solid Films, 153: pp. 287–301 (1987).

Polasko, et al., "Thin Silicon Films used as Antireflection Coatings for Metal Coated Substrates," SPIE vol. 631, Advances in Resist Technology and Processing III; pp. 180–186 (1986).

Wittmer, "Properties and Microelectronic Applications of Thin Films of Refractory Metal Nitrides," J. Vac. Sci. Technol. A 3 (4); pp. 1797–1803 (1985).

Johnson, et al., "Plasma–Enhanced CVD Silicon Nitride Antireflection Coatings for Solar Cells," Solar Energy; pp. 355–358 (1983).

PROCESS FOR FORMING A SEMICONDUCTOR DEVICE WITH AN ANTIREFLECTIVE LAYER

FIELD OF THE INVENTION

The present invention relates to semiconductor devices, and in particular, to forming the semiconductor devices using antireflective layers.

BACKGROUND OF THE INVENTION

Many conductive layers, such as silicon, aluminum, and the like, are too reflective and cause problems, such as reflective notching, when patterning a photoresist layer that overlies the conductive layer. At short wavelengths, materials are generally more reflective, and therefore, an antireflective layer may become virtually required. Antireflective layers are used to reduce the likelihood of printing problems, such as reflective notching. Examples of antireflective layers include silicon nitride, silicon-rich silicon nitride, silicon oxynitride, titanium nitride, or the like.

As used in this specification, a reflective layer is not considered part of an antireflective layer. Silicon layers may be used as a gate electrode or local interconnect and is generally reflective. Patterning a photoresist layer over these layers typically results in reflective notching if an antireflective layer is not used.

Typically, an antireflective layer having a uniform composition is used. However, a uniform composition antireflective layer can have problems being integrated into an existing process flow. Silicon nitride does not adhere well to some refractory metal silicides. Silicon-rich silicon nitride can act as a leakage path between conductors or react with an adjacent layer or certain ambients, such as oxygen.

BRIEF DESCRIPTION OF THE DRAWINGS

The present invention is illustrated by way of example and not limitation in the accompanying figures, in which like references indicate similar elements, and in which.

DETAILED DESCRIPTION

The embodiments described below include a nitrogen-containing antireflective layer that either has a continuously graded composition or includes a plurality of discrete portions that make up the antireflective layer. The antireflective layer allows a low reflectance antireflective layer to be formed that can be integrated into an existing process without causing other problems. Compare this with the prior art that has a single layer of relatively uniform composition that could have adherence, current leakage, or reactivity problems. The present invention is better understood with the embodiments described below.

General Concepts

The embodiments described below have an antireflective layer that is typically inorganic. One location of the antireflective layer that is closer to a substrate typically has a formula of $M_a N_b O_c$, and another location further from the substrate has a formula of $X_d N_e O_f$. M and X are any element, although they usually are silicon, germanium, boron, phosphorus, aluminum, molybdenum, tantalum, titanium, tungsten, or the like. M and X can be the same element or different elements. N is nitrogen, and O is oxygen. The two locations have different compositions even if M and X are the same element.

Referring to the subscripts, a, b, d, and e are greater than zero because nitride-containing materials make good antireflective layers. If one of the portions is silicon-rich silicon nitride, M is silicon, a/b is greater than ¾, and c is 0. For silicon oxynitride, M is silicon, and a, b, and c are greater than zero. Stoichiometric silicon nitride is $Si_3N_4$. As used in this specification, stoichiometric means that the composition is such that the ratio of the elements is capable of forming a neutrally charged, entirely molecular compound. Silicon-rich silicon nitride and silicon oxynitride are examples of nonstoichiometric materials.

The antireflective layer is typically formed by low pressure chemical vapor deposition at a temperature of at least 600 degrees Celsius, plasma-enhanced chemical vapor deposition at a temperature no higher than 480 degrees Celsius, or sputter deposition using multiple targets or reactive sputtering. The antireflective layer typically has a thickness in a range of 100–1000 angstroms and often has a thickness in a range of 200–500 angstroms.

When a metal-containing layer is being patterned, M and X are typically metals, and the subscripts for c and f are typically zero. Examples of those metals include aluminum, molybdenum, tantalum, titanium, and tungsten, or the like. Many metal oxides are insulators and the use of such materials can cause high via resistance or difficulties at wiring bonding.

If the only concern is that the antireflective layer has good radiation absorption and not be conductive, one embodiment can be as simple as using a portion that includes silicon-rich silicon nitride and a portion that includes stoichiometric silicon nitride. Note that the two portions are at different locations with the antireflective layer and have the same elements (silicon and nitrogen) but different compositions. Stoichiometric silicon nitride is an insulator and prevents conductive members from being electrically connected to each other. The silicon-rich silicon nitride portion allows the antireflective layer to have a lower reflectance than stoichiometric silicon nitride by itself.

Figure 1:
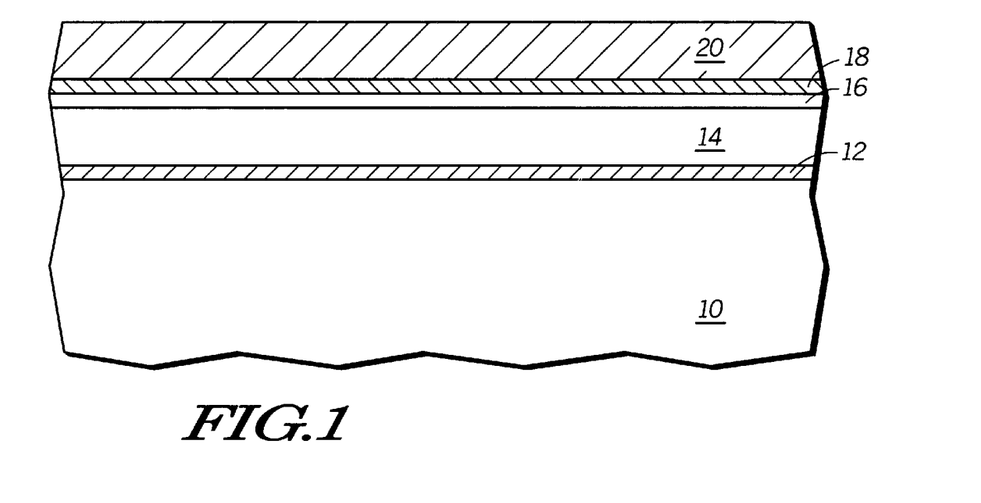
FIG. 1 includes an illustration of a cross-sectional view of a portion of a semiconductor substrate after forming an antireflective layer in accordance with one embodiment of the present invention.
Figure 2:
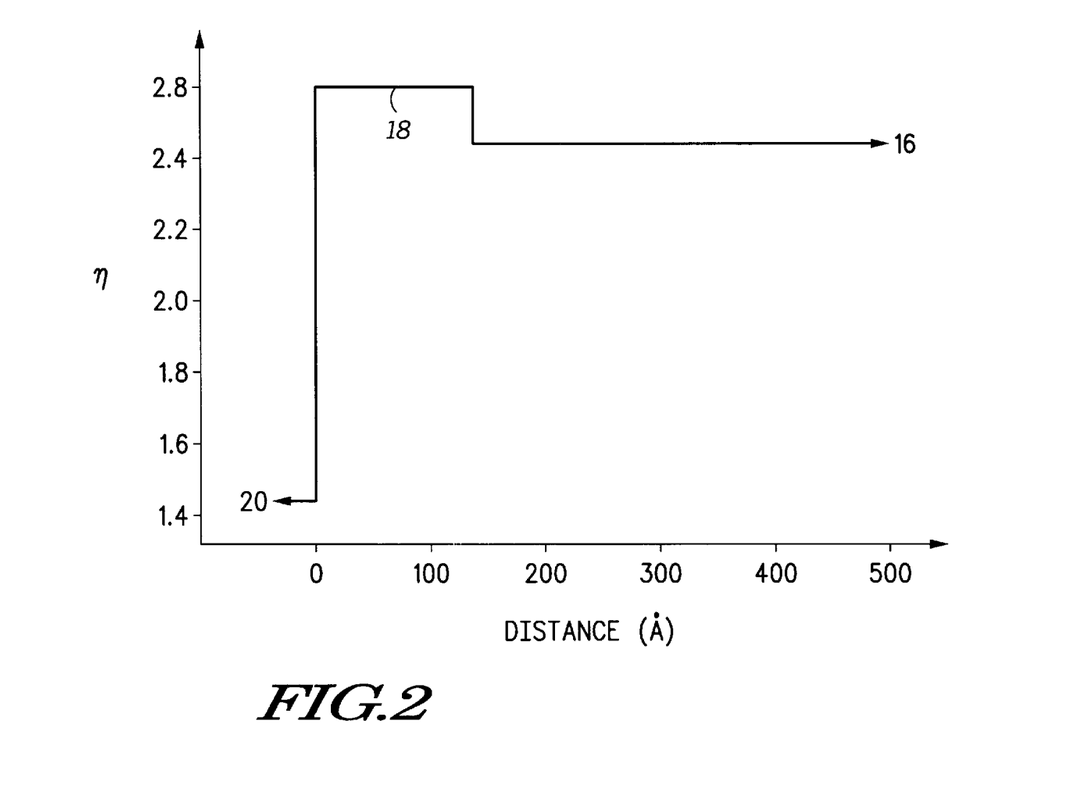
FIG. 2 includes a plot of refractive index as a function of distance from an interface between oxide and antireflective layers.
Figure 3:
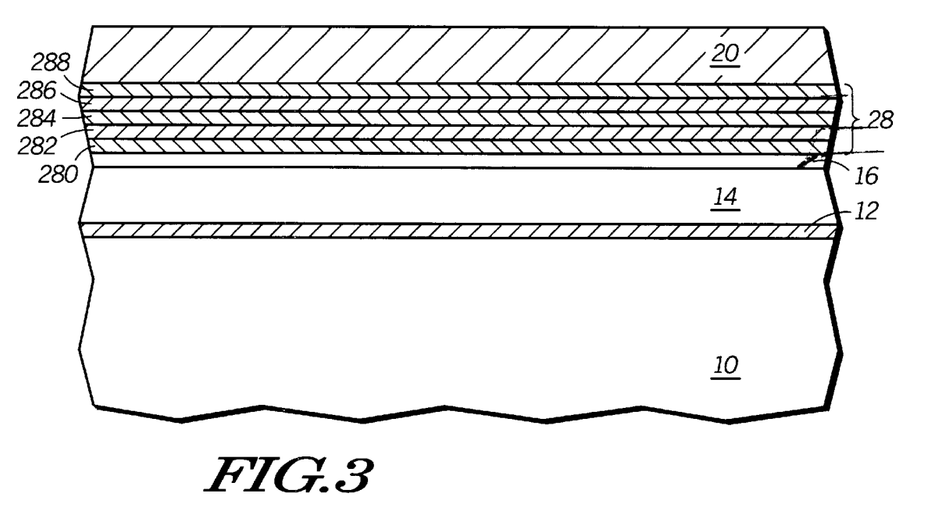
FIG. 3 includes an illustration of a cross-sectional view of a portion of a semiconductor substrate after forming an antireflective layer in accordance with another embodiment of the present invention.
Figure 4:
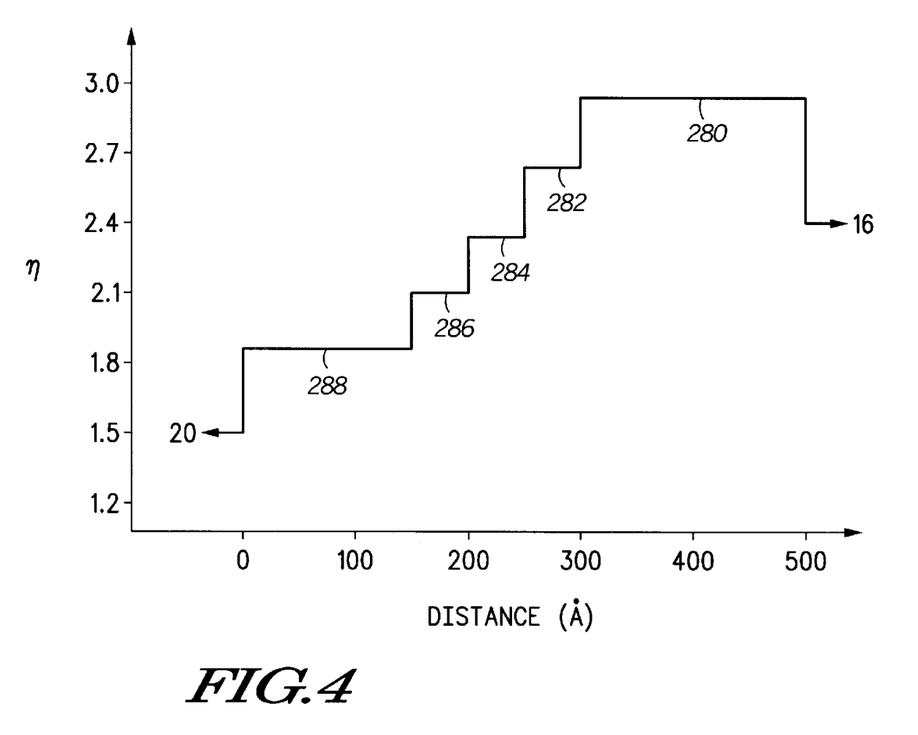
FIG. 4 includes a plot of refractive index as a function of distance from an interface between oxide and antireflective layers.

The antireflective layer can include a layer having continuous change in refractive index or discrete portions or layers having relatively smaller changes in refractive indices. In FIG. 1, semiconductor substrate 10 is covered by dielectric layer 12, polysilicon layer 14, titanium silicide layer 16, antireflective layer 18, and oxide layer 20. FIG. 2 includes a plot of refractive index as a function of distance from the interface between oxide layer 20 and antireflective layer 18. FIG. 3 includes another embodiment using a plurality of discrete portions. Referring to FIG. 3, antireflective layer 18 is replaced by antireflective layer 28 that includes portions 280, 282, 284, 286, and 288. Portions 280, 282, 284, 286 are silicon-rich silicon nitride layers that have decreasing amounts of silicon (i.e., portion 280 has a higher silicon to nitrogen ratio compared to portion 282, etc.). These layers include the same elements but have different compositions. Portion 288 includes silicon oxynitride. FIG. 4 includes a plot of refractive index as a function of distance from the oxide layer 20 towards the titanium silicide layer 16.

Figure 5:
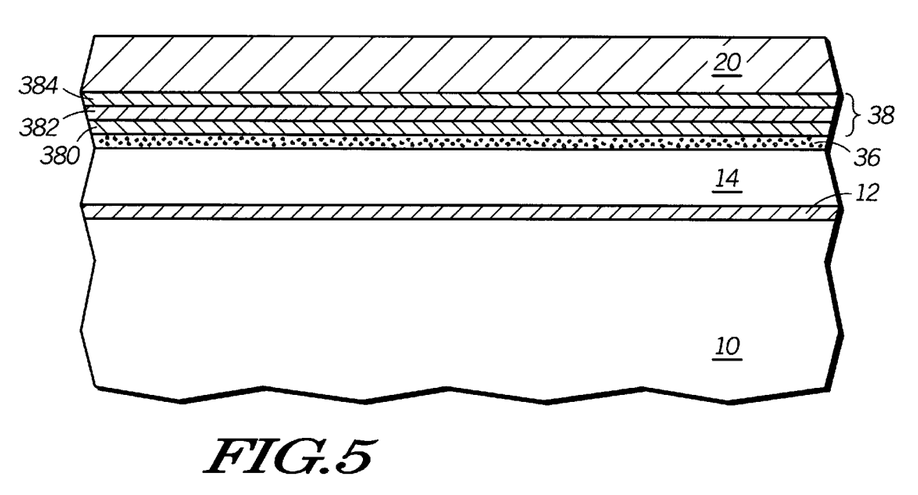
FIG. 5 includes an illustration of a cross-sectional view of a portion of a semiconductor substrate after forming an antireflective layer in accordance with yet another embodiment of the present invention.

In yet another use of the present invention, a stronger absorbing antireflective material is part of the antireflective layer but needs to be protected. Referring to FIG. 5, semiconductor substrate 10 is covered by dielectric layer 12, polysilicon layer 14, thin oxide layer 36, antireflective layer 38, and oxide layer 20. In this particular embodiment, antireflective layer 38 includes portions 380, 382, and 384 that are at different locations in the antireflective layer 38. Portion 382 has a higher absorption coefficient than portions 380 and 384. Also, portion 382 has a higher refractive index than each of the oxide layers 20 and 36 and each of the portions 380 and 384. In this example, portion 382 might need to be protected because it is too conductive, water soluble, etches in chemistry similar to an overlying layer (i.e., oxide layer 20), has an undesired reaction with an immediately adjacent layer, does not adhere well to oxide, or some other reason.

Figure 6:
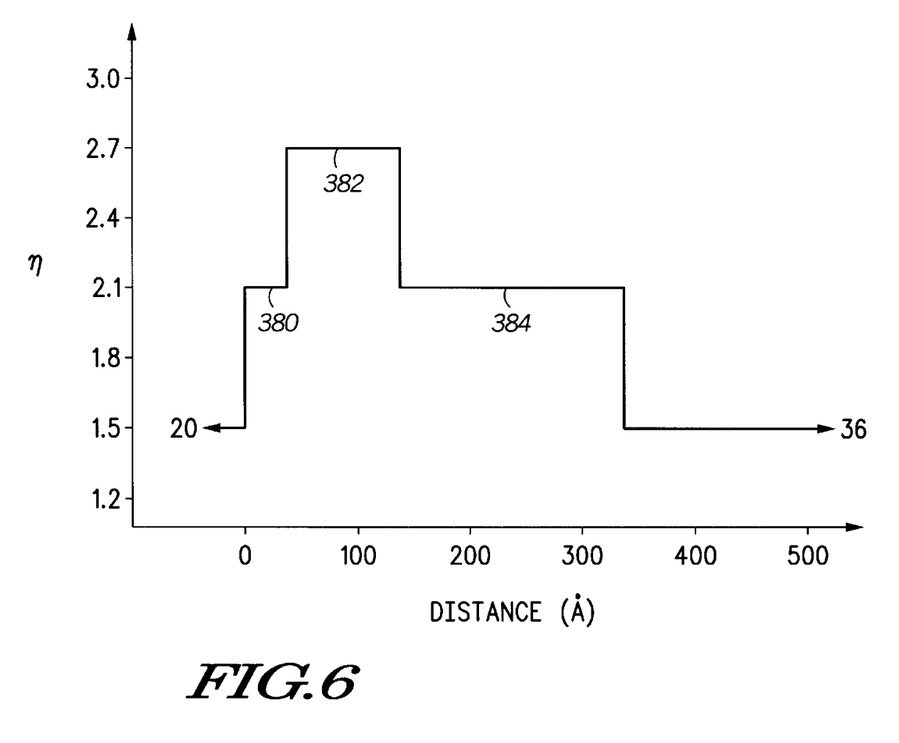
FIG. 6 includes a plot of refractive index as a function of distance from an interface between oxide and antireflective layers.

FIG. 6 includes a plot of refractive index as a function of a distance from the interface between the oxide and antireflective layers 20 and 38, respectively. Portion 380 is a protective layer for portion 382. Portion 380 is typically only as thick as needed to act as a protective layer and is typically no more than 75 angstroms thick. In FIG. 6, portions 380, 382, and 384 are 50, 100, and 200 angstroms thick, respectively.

All the refractive indices given within this example are at a wavelength of 365 nanometers that generally corresponds to the i-line of visible radiation. Absorption and refractive index for a material typically change with a change in the radiation source. For example, an antireflective layer that is optimal for a wavelength of 365 nanometers may need changed to be optimal for 248 nanometers (deep ultraviolet). The present invention is not limited to the visible light spectrum. Radiation outside of the visible light spectrum may be used, although composition and thickness of the antireflective layer may need to be optimized for the radiation used.

Formation of a Semiconductor Device

Figure 7:
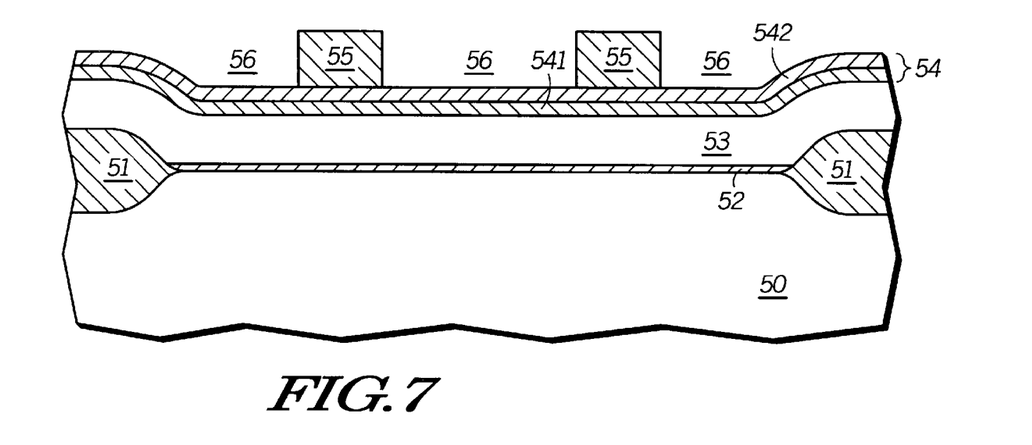
FIG. 7 includes an illustration of a cross-sectional view of a portion of a semiconductor substrate after forming a photoresist members.

FIG. 7 includes a cross-sectional view of a portion of a semiconductor substrate 50, such as p-type monocrystalline silicon. Field isolation regions 51 and a gate dielectric layer 52 overlie the substrate 50. A doped polysilicon layer 53 is formed over the gate dielectric layer and the field isolation regions. An antireflective layer 54 is formed over the doped polysilicon layer 53. In this particular embodiment, the antireflective layer 54 includes a silicon-rich silicon nitride portion 541 and a stoichiometric silicon nitride portion 542. A photoresist layer is coated over the substrate and is patterned to form photoresist members 55 and openings 56 as shown in FIG. 7. The patterning of the photoresist members 55 is less likely to result in reflective notching or other complications because of the presence of the antireflective layer 54 that includes portions 541 and 542.

Figure 8:
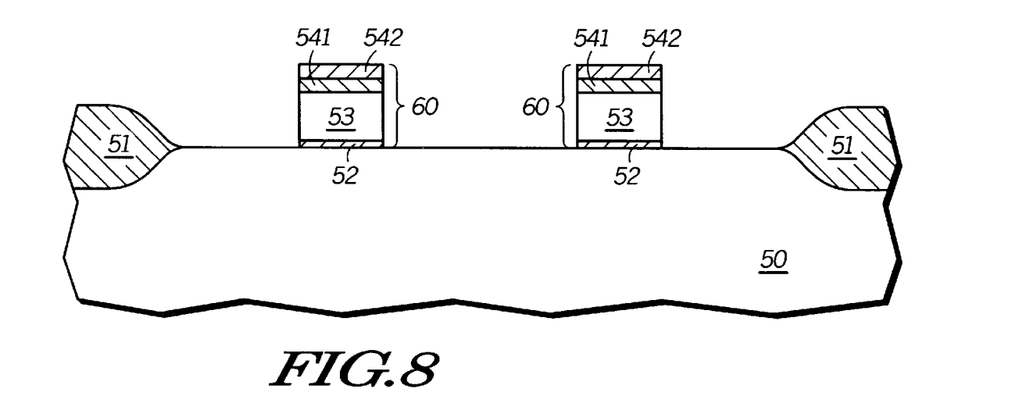
FIG. 8 includes an illustration of a cross-sectional view of the substrate of FIG. 7 after forming gate electrode structures.

The layers 52–54 are patterned to form gate structures 60 as shown in FIG. 8. The antireflective layer 54 is etched using a fluorine-containing gas that includes carbon tetrafluoride, trifluoromethane, or the like. In one specific embodiment, the antireflective layer 54 is etched using a combination of carbon tetrafluoride and trifluoromethane. The layers 52 and 53 are etched using conventional etching techniques. After forming the gate structures 60, the photoresist members 55 are removed using a plasma ashing process. Alternatively, both the photoresist members and the antireflective layer could be removed, thereby leaving the patterned portions of layers 52 and 53 as gate structures 60.

Figure 9:
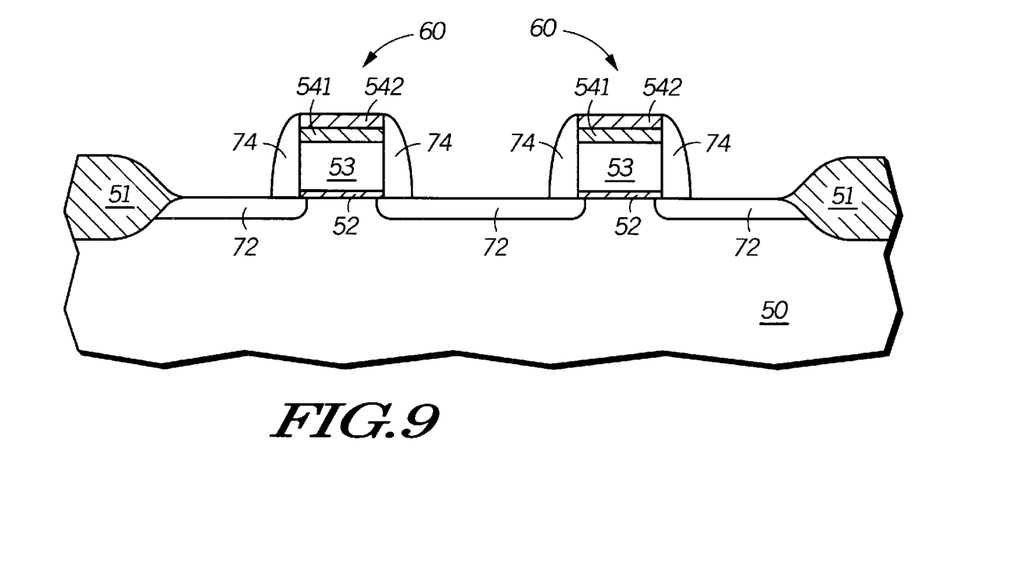
FIG. 9 includes an illustration of a cross-sectional view of the substrate of FIG. 6 after forming spacers and doped regions.

The substrate is further processed to form sidewall spacers 74 and doped regions 72 within the substrate 50 adjacent to the gate structures 60 as shown in FIG. 9. The spacers 74 include oxide, nitride, or a combination of these materials. Doped regions 72 are source/drain regions near the gate structures 60.

Figure 10:
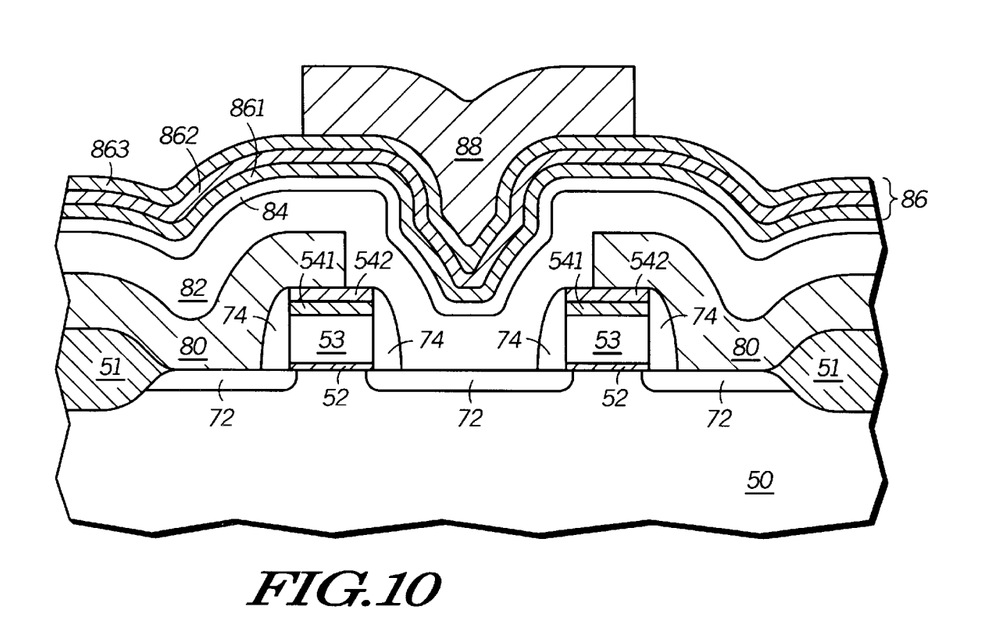
FIG. 10 includes an illustration of a cross-sectional view of the substrate of FIG. 9 after forming another photoresist members.

An insulating layer 80 is formed over the substrate and patterned to form an opening over the center doped region 72 as shown in FIG. 10. A doped polysilicon layer 82, a tungsten silicide layer 84, and an antireflective layer 86 are formed over the substrate 50 and insulating layer 80. The antireflective layer 86 includes tungsten-rich tungsten nitride portions 861 and 862 and a stoichiometric tungsten nitride portion 863. Note that the portions 861–863 have increasing amounts of nitrogen as the distance from the substrate 50 increases. When comparing portions 861 and 862, portion 861 is the more tungsten rich.

Figure 11:
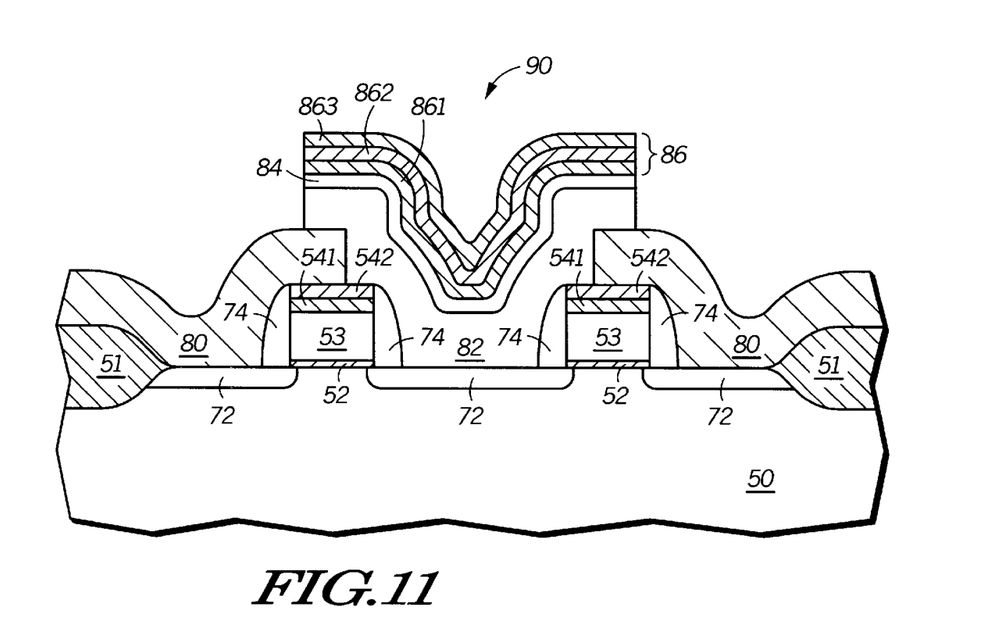
FIG. 11 includes a cross-sectional view of the substrate of FIG. 10 after forming a contact structure.

A photoresist layer is formed and patterned over the antireflective layer 86 to form a photoresist member 88. The antireflective layer 86, the tungsten silicide layer 84, and doped polysilicon layer 82 are then patterned to form a contact structure 90 as shown in FIG. 11. After formation of the contact structure 90, the photoresist member 88 is removed. As can be seen in FIG. 11, the contact structure 90 makes contact to the center doped region 72. Other contact structures similar to contact structure 90 are formed but are not shown in FIG. 11. The antireflective layer 86 could be removed if this is so desired. Alternatively, only a portion of it could be removed.

If the antireflective layer 54 was a single layer of silicon-rich silicon nitride, an electrical leakage path would be formed between the contact structure 90 and the doped polysilicon layer 53. In essence, a source/drain region (center doped region 72) is resistively connected to the gate electrodes (polysilicon layer 53) of the gate structures. By using the combination of the silicon-rich silicon nitride portion 541 and the stoichiometric silicon nitride portion 542, a leakage path is not formed between the center doped region 72 and the polysilicon layer 53 of the gate structures as shown in FIG. 11. Clearly, a leakage path is undesired.

Figure 12:
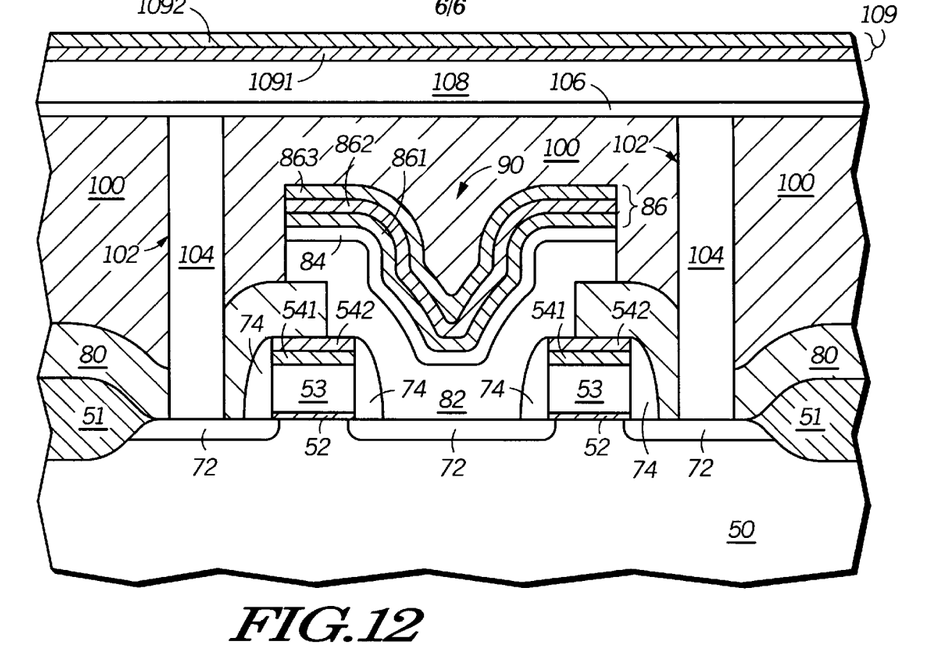
FIG. 12 includes an illustration of a cross-sectional view of the substrate of FIG. 9 after forming an interconnecting layer and still another antireflective layer.

An insulating layer 100 is formed over the contact structure 90 and the rest of the substrate 50 and is patterned to form contact openings 102 as shown in FIG. 12. The contact openings 102 are filled with a conductive material to form contact plugs 104. The contact plugs 104 include tungsten and adhesion or barrier layers. After the contact plugs 104 are formed, a barrier layer 106, an interconnecting layer 108, and an antireflective layer 109 are formed. Optionally, an adhesion layer lies between the oxide and barrier layers 100 and 106 but is not shown in FIG. 12.

The choice of materials for layers 106 and 109 depends upon the selection of materials for interconnecting layer 108. For example, if the interconnecting layer 108 includes aluminum, the barrier layer 106 could include titanium nitride, and the antireflective layer 109 could include an aluminum-rich aluminum nitride portion 1091 and a stoichiometric aluminum nitride portion 1092. If the interconnecting layer 108 includes copper, then the barrier layer 106 could include tantalum, molybdenum, tantalum-containing or molybdenum-containing materials, or the like, and the antireflective layer 109 includes a lower portion 1091 and an upper portion 1092. For a copper interconnecting layer 108, the lower portion 1091 typically includes tantalum-rich tantalum nitride or molybdenum-rich molybdenum nitride, and the upper portion 1092 typically includes stoichiometric tantalum nitride or stoichiometric molybdenum nitride.

Figure 13:
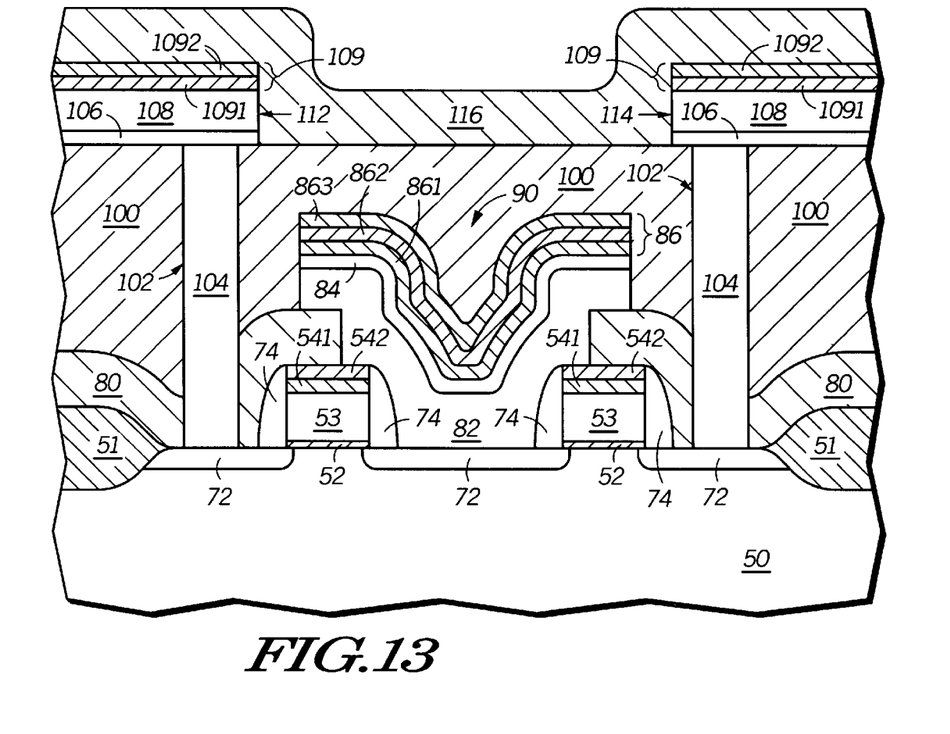
FIG. 13 includes an illustration of the substrate of FIG. 12 after forming a substantially completed device.

Layers 106, 108, and 109 are patterned to form interconnects 112 and 114 as shown in FIG. 13. The interconnects 112 and 114 and insulating layer 100 are covered by a passivation layer 116. Again, the materials used for the passivation layer depend upon the materials of the interconnecting layer 108. For example, if the interconnecting layer 108 includes aluminum, the passivation layer includes oxide, nitride, or oxynitride. However, if the interconnecting layer 108 includes copper, the passivation layer 116 includes a nitride layer immediately adjacent to the copper to prevent any out diffusion that would possibly occur if oxide would contact the copper.

As shown in FIG. 13, the interconnects 112 and 114 are electrically connected to the outer doped regions 72 within substrate 50. Other electrical connections are made within the semiconductor device shown in FIG. 13 but are not shown. For example, electrical connections are made to the contact structure 90 and the polysilicon layer 53 but are not shown in FIG. 13. If needed, other insulating layers and interconnecting levels could be formed.

Other embodiments of the present invention can be made. Although the figures illustrate discrete portions, any of the antireflective layer could a single layer having a continuously graded composition rather than discreet portions. Using antireflective layer 54 as an example, antireflective layer 54 could be formed such that the silicon to nitrogen ratio decreases as the layer becomes thicker. The continuously graded antireflective layer would be formed by decreasing the silicon source gas flow rate or increasing the nitrogen source gas flow rate while varying other deposition parameter(s), such as power, pressure, spacing, etc., so as to maintain the desired film properties (i.e., uniformity, etch rate, etc.) during the deposition. Still, this single layer includes a location near the polysilicon layer 53 that has a different composition than another location of that single layer further from the polysilicon layer 53.

In still another embodiment, different elements can be used in the different portions of a single antireflective layer.

Using antireflective layer 86 as an example, the portions 861 and 862 have tungsten and nitrogen, and portion 863 includes stoichiometric silicon nitride. In this manner, portion 863 is an insulator. In alternate embodiments, other materials are used for other reasons that are not related to lithographic issues. In still other embodiments, an antireflective layer could include a nitrogen rich portion.

Usually, at least one portion of an antireflective layer is nonstoichiometric. In some embodiments, all portions may be nonstoichiometric. For portion 542, stoichiometric silicon nitride can be replaced by nitrogen-rich silicon nitride. In this manner, antireflective layer 54 only has nonstoichiometric portions.

Benefits

The antireflective layers described above can be easily integrated into virtually any process flow without causing problems. A uniform composition antireflective layer as used in the prior art can be too reflective, form a leakage path, can be water soluble, etch in chemistry used to etch an overlying layer, can have an undesired reaction with an immediately adjacent layer, may not adhere well to underlying or overlying layers, or cause some other problem. An antireflective layer formed in accordance with the present invention can be formed to give low reflectance without any of the problems listed above.

Another benefit is that a variety of materials and deposition methods can be used in forming the antireflective layers. The antireflective layer can be integrated into an existing process flow without having to use marginal processing steps.

In the foregoing specification, the invention has been described with reference to specific embodiments thereof. However, it will be evident that various modifications and changes can be made thereto without departing from the scope of the invention as set forth in the appended claims. Accordingly, the specification and figures are to be regarded in an illustrative rather than a restrictive sense.

We claim:

1. A process for forming a semiconductor device comprising the steps of:

forming a first layer over a semiconductor substrate, wherein the first layer is conductive;

forming an antireflective layer over the first layer, wherein:

the antireflective layer includes a first location, a second location, and a third location lying between the first and second locations, wherein the third location has a higher absorption coefficient compared to each of the first and second locations;

the first location includes a first element and nitrogen;

the second location includes a second element and nitrogen;

the antireflective layer has a first nitrogen content at a first portion that includes the first location and a second nitrogen content at a second portion that includes the second location; and the second nitrogen content is higher than the first nitrogen content;

patterning the first layer and the antireflective layer to form a first member including a remaining portion of the first layer, wherein the remaining portion of the first layer is at least part of a gate electrode, a contact structure, or an interconnect; and forming a conductive member near the remaining portion of the first layer, wherein:

the conductive member abuts the antireflective layer; and the conductive member is spaced apart from the remaining portion of the first layer.

2. The process of claim 1, wherein at least one of the first and second locations is nonstoichiometric.

3. The process of claim 1, wherein the first and second elements are selected from a group consisting of silicon, germanium, boron, phosphorus, aluminum, molybdenum, tantalum, titanium, and tungsten.

4. The process of claim 1, wherein:

the first location includes silicon-rich silicon nitride; and the second location includes a material selected from a group consisting of stoichiometric silicon nitride and nitrogen-rich silicon nitride.

5. The process of claim 1, wherein:

the first layer includes a metal-containing layer; and the first and second elements are selected from a group consisting of aluminum, molybdenum, tantalum, titanium, and tungsten.

6. The process of claim 1, further comprising a step of forming a second layer over and adjacent to the second location of the antireflective layer, wherein:

the first layer has a first refractive index;

the second layer has a second refractive index that is different from the first refractive index;

the first location has a third refractive index that is closer to the first refractive index compared to the second refractive index; and the second location has a fourth refractive index that is closer to the second refractive index compared to the first refractive index.

7. The process of claim 1, further comprising a step of forming a second layer over and adjacent to the second location of the antireflective layer, wherein:

the first layer has a first refractive index;

the second layer has a second refractive index; and the third location has a third refractive index that is higher than each of the first and second refractive indices.

8. The process of claim 1, wherein the antireflective layer is formed by a deposition selected from a group consisting of:

low pressure chemical vapor deposition at a temperature of at least 600 degrees Celsius;

plasma-enhanced chemical vapor deposition at a temperature no higher than 480 degrees Celsius; and sputter deposition.

9. The process of claim 1, further comprising a step of forming a passivation layer over the remaining portion of the first layer and the conductive member.

10. The process of claim 1, wherein the step of patterning is performed using a fluorine-containing gas.

11. The process of claim 1, wherein the first layer includes a material selected from a group consisting of silicon, aluminum, and copper.

12. The process of claim 1, further comprising a step of forming conductive members on at least portions of the antireflective layer.

13. The process of claim 1, wherein the antireflective layer has a thickness no greater than approximately 500 angstroms.

14. A process for forming a semiconductor device comprising the steps of:

forming a first layer over a semiconductor substrate, wherein the first layer is conductive;

forming an antireflective layer over the first layer, wherein:

the antireflective layer includes a first location and a second location;

the first location includes nitrogen and has a first parameter type with a first value;

the second location includes nitrogen and has the first parameter type with a second value;

the first parameter type is selected from a group consisting of refractive index and absorption coefficient; and the first value is greater than the second value;

patterning the first layer and the antireflective layer to form a first member including a remaining portion of the first layer, wherein the remaining portion of the first layer is at least part of a gate electrode, a contact structure, or an interconnect;

forming a second layer over and adjacent to the second location of the antireflective layer, wherein:

the first layer has a third value of the first parameter type;

the second layer has a fourth value of the first parameter type that is different from the third value;

the first value is closer to the third value compared to the fourth value; and the second value is closer to the fourth value compared to the third value; and forming a conductive member near the remaining portion of the first layer, wherein:

the conductive member abuts the antireflective layer; and the conductive member is spaced apart from the remaining portion of the first layer.

15. The process of claim 14, wherein:

the step of forming the antireflective layer is performed such that the antireflective layer includes a third location overlying the second location;

the third location has a fifth value of the first parameter type; and the second value is higher than each of the first, third, fourth, and fifth values.

16. The process of claim 14, wherein the step of forming the antireflective layer is performed such that the antireflective layer includes a third location overlying the second location, wherein:

the third location has a fifth value of the first parameter type; and the second value is higher than each of the first and fifth values.

17. The process of claim 14, wherein the step of forming the antireflective layer is performed such that the antireflective layer includes a third location overlying the second location, wherein;

the first location has a first value of a second parameter type;

the second location has a second value of the second parameter type;

the third location has a third value of the second parameter type;

the second parameter type is different from the first parameter type;

the second parameter type is selected from a group consisting of refractive index and absorption coefficient; and the second value of the second parameter type is higher than each of the first and third values of the second parameter type.

18. The process of claim 14, wherein the step of forming the antireflective layer is performed such that:
the first location further includes a first element that is different from nitrogen;
the second location further includes a second element that is different from nitrogen; and
the first and second locations have different compositions.

19. The process of claim 18 wherein the first and second elements are selected from a group consisting of silicon, germanium, boron, phosphorus, aluminum, molybdenum, tantalum, titanium, and tungsten.

20. The process of claim 18, wherein the step of forming the antireflective layer is performed such that at least one of the first and second locations is nonstoichiometric.

21. The process of claim 18, wherein:
the first location includes silicon-rich silicon nitride; and
the second location includes a material selected from a group consisting of stoichiometric silicon nitride and nitrogen-rich silicon nitride.

22. The process of claim 21, wherein:
the first layer includes a metal-containing layer; and
the first and second elements are selected from a group consisting of aluminum, molybdenum, tantalum, titanium, and tungsten.

23. The process of claim 14, further comprising a step of forming a passivation layer over the remaining portion of the first layer and the conductive member.

24. The process of claim 14, wherein the step of patterning is performed using a fluorine-containing gas.

25. The process of claim 14, wherein the first layer includes a material selected from a group consisting of silicon, aluminum, and copper.

26. The process of claim 14, wherein the antireflective layer is formed by a deposition selected from a group consisting of:
low pressure chemical vapor deposition at a temperature of at least 600 degrees Celsius;
plasma-enhanced chemical vapor deposition at a temperature no higher than 480 degrees Celsius; and
sputter deposition.

27. The process of claim 14, further comprising a step of forming conductive members on at least portions of the antireflective layer.

28. The process of claim 14, wherein the antireflective layer has a thickness no greater than approximately 500 angstroms.

29. A process for forming a semiconductor device comprising the steps of:
forming a metal-containing layer over a semiconductor substrate; and
forming an antireflective layer over the metal-containing layer, wherein:
the antireflective layer includes a first location and a second location;
the first location includes a first element and nitrogen;
the second location includes a second element and nitrogen;
the first and second elements are selected from a group consisting of aluminum, molybdenum, tantalum, titanium, and tungsten; and
the first and second locations have different compositions.

30. A process for forming a semiconductor device comprising the steps of:
forming a first layer over a semiconductor substrate, wherein the first layer has a first absorption coefficient and a first refractive index;
forming an antireflective layer over the first layer, wherein:
the antireflective layer includes a first location and a second location that overlies the first location;
the first location has a second absorption coefficient and a second refractive index, wherein the second absorption coefficient is different from the first absorption coefficient, and the second refractive index is different from the first refractive index; and
the second location has a third absorption coefficient and a third refractive index; and
forming a second layer over the antireflective layer, wherein the second layer has a fourth absorption coefficient and a fourth refractive index, and wherein, the fourth absorption coefficient is different from the third absorption coefficient, and the fourth refractive index is different from the third refractive index,
wherein the semiconductor device has a characteristic selected from a group consisting of:
(a) the second refractive index is closer to the first refractive index compared to the fourth refractive index; and
the third refractive index is closer to the fourth refractive index compared to the first refractive index; and
(b) the second absorption coefficient is closer to the first absorption coefficient compared to the fourth absorption coefficient; and
the third absorption coefficient is closer to the fourth absorption coefficient compared to the first absorption coefficient.

31. The process of claim 30, wherein:
the step of forming the antireflective layer is performed such that the antireflective layer includes a third location lying between the first and second locations;
the third location has a value of a parameter type selected from a group consisting of refractive index and absorption coefficient; and
the value of the parameter type for the third location is higher than each of the first, second, third and fourth refractive indices or the first, second, third, and fourth absorption coefficient, as appropriate.

32. The process of claim 30, wherein:
the step of forming the antireflective layer is performed such that the antireflective layer includes a third location overlying the second location;
the value at the third location, wherein the value has a parameter type selected from a group consisting of refractive index and absorption coefficient; and
the value of the parameter type for the third location is lower than the second refractive index or second absorption coefficient, as appropriate.

33. The process of claim 30, wherein the step of forming the antireflective layer is performed such that:
the first location further includes a first element that is different from nitrogen;
the second location further includes a second element that is different from nitrogen; and
the first and second locations have different compositions.

34. The process of claim 33, wherein the first and second elements are selected from a group consisting of silicon, germanium, boron, phosphorus, aluminum, molybdenum, tantalum, titanium, and tungsten.

35. The process of claim 33, wherein the step of forming the antireflective layer is performed such that at least one of the first and second locations is nonstoichiometric.

36. The process of claim 33, wherein:

the first location includes silicon-rich silicon nitride; and the second location includes a material selected from a group consisting of stoichiometric silicon nitride and nitrogen-rich silicon nitride.

37. The process of claim 33, wherein:

the first layer includes a metal-containing layer; and the first and second elements are selected from a group consisting of aluminum, molybdenum, tantalum, titanium, and tungsten.

38. The process of claim 30, wherein the antireflective layer is formed by a deposition selected from a group consisting of:

low pressure chemical vapor deposition at a temperature of at least 600 degrees Celsius;

plasma-enhanced chemical vapor deposition at a temperature no higher than 480 degrees Celsius; and sputter deposition.

39. The process of claim 30, further comprising a step of forming a passivation layer over the second layer.

40. The process of claim 30, wherein the first layer includes a material selected from a group consisting of silicon, aluminum, and copper.

41. The process of claim 30, further comprising a step of forming conductive members on the antireflective layer.

42. The process of claim 30, wherein the antireflective layer has a thickness no greater than approximately 500 angstroms.

* * * * *